United States Patent
Wu

(10) Patent No.: US 6,455,383 B1
(45) Date of Patent: Sep. 24, 2002

(54) METHODS OF FABRICATING SCALED MOSFETS

(75) Inventor: Ching-Yuan Wu, Hsinchu (TW)

(73) Assignee: Silicon-Based Technology Corp., Hsinchu (TW)

(*) Notice: Subject to any disclaimer, the term of this patent is extended or adjusted under 35 U.S.C. 154(b) by 0 days.

(21) Appl. No.: 10/045,249

(22) Filed: Oct. 25, 2001

(51) Int. Cl.$^7$ ............... H01L 21/336; H01L 21/3209; H01L 21/4763

(52) U.S. Cl. ............ 438/296; 438/303; 438/305; 438/592; 438/595; 438/596

(58) Field of Search .................. 438/296, 303, 438/305, 592, 595, 596

(56) References Cited

U.S. PATENT DOCUMENTS

| | | | | |
|---|---|---|---|---|
| 5,132,745 A | * | 7/1992 | Kwasnick et al. | 357/4 |
| 5,356,823 A | * | 10/1994 | Mitani | 437/40 |
| 5,445,983 A | * | 8/1995 | Hong | 437/43 |
| 5,447,875 A | * | 9/1995 | Moslehi | 437/41 |
| 5,472,897 A | * | 12/1995 | Hsu et al. | 437/44 |
| 5,766,988 A | * | 6/1998 | Cho et al. | 438/159 |
| 5,789,778 A | * | 8/1998 | Murai | 257/325 |
| 5,796,151 A | * | 8/1998 | Hsu et al. | 257/410 |
| 5,877,530 A | * | 3/1999 | Aronwitz et al. | 257/344 |
| 5,918,141 A | * | 6/1999 | Merill | 438/583 |
| 5,920,783 A | * | 7/1999 | Tseng et al. | 438/305 |
| 5,960,270 A | * | 9/1999 | Misra et al. | 438/197 |
| 5,970,354 A | * | 10/1999 | Hause et al. | 438/305 |
| 6,015,736 A | * | 1/2000 | Luning et al. | 438/264 |
| 6,060,375 A | * | 5/2000 | Owyaang et al. | 438/585 |
| 6,187,643 B1 | * | 2/2001 | Borland | 438/302 |
| 6,207,995 B1 | * | 3/2001 | Gardner et al. | 257/344 |
| 6,271,132 B1 | * | 8/2001 | Xaing et al. | 438/682 |
| 6,333,244 B1 | * | 12/2001 | Yu | 438/528 |
| 6,335,250 B1 | * | 1/2002 | Egi | 436/300 |
| 6,368,947 B1 | * | 4/2002 | Yu | 438/530 |

FOREIGN PATENT DOCUMENTS

| | | | |
|---|---|---|---|
| EP | 0 436 192 A1 | * | 7/1991 |
| JP | 6-132299 | * | 5/1994 |

* cited by examiner

Primary Examiner—Jerome Jackson
Assistant Examiner—Shrinivas H. Rao
(74) Attorney, Agent, or Firm—Powell Goldstein Frazer & Murphy LLP

(57) ABSTRACT

The scaled MOSFETs having a conductive barrier-metal layer sandwiched between a metal layer or a thick silicide layer on the top and a first conductive gate layer at the bottom are disclosed by the present invention, in which the first conductive gate layer is etched to form a steep-gate structure or a taper-gate structure. The metal layer is encapsulated by a second masking dielectric layer formed on the top and a first dielectric spacer formed on both sides, no interaction would occur between the metal layer and the first conductive gate layer, a highly-conductive nature of the metal layer for gate interconnection can be preserved. A thick silicide layer is formed by a two-step self-aligned silicidation process and a conductive barrier-metal layer is formed to eliminate the interaction between the thick silicide layer and the first conductive gate layer, a highly conductive nature of the thick silicide layer for gate interconnection can be obtained. Moreover, the field-emission between the gate and the shallow moderately doped source/drain diffusion region can be minimized by a graded gate-oxide layer formed near the gate edges and the field emission between the trench corners of the semiconductor substrate and the gate can be completely eliminated by a flat shallow-trench-isolation structure.

20 Claims, 13 Drawing Sheets

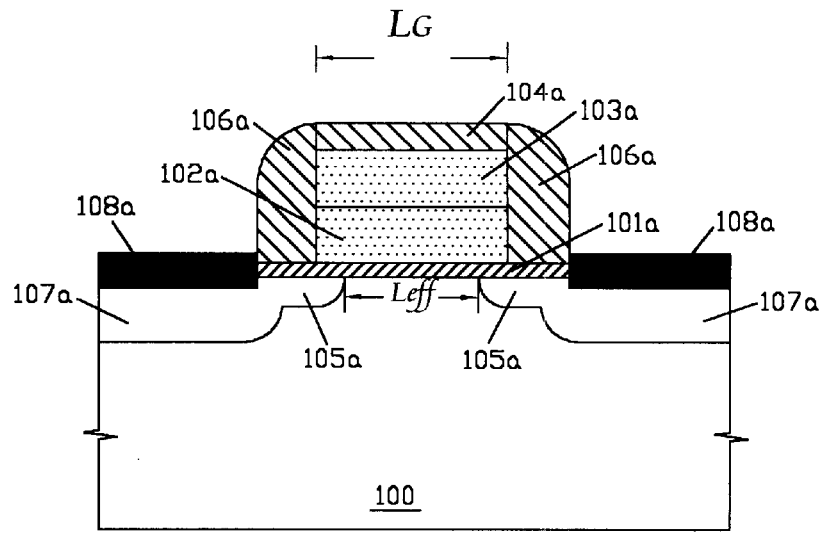
*FIG.1A(PRIOR ART)*
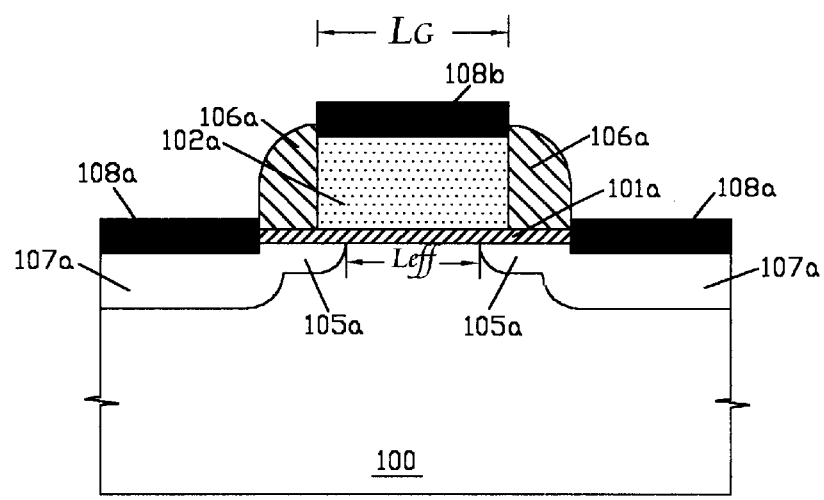
*FIG.1B(PRIOR ART)*
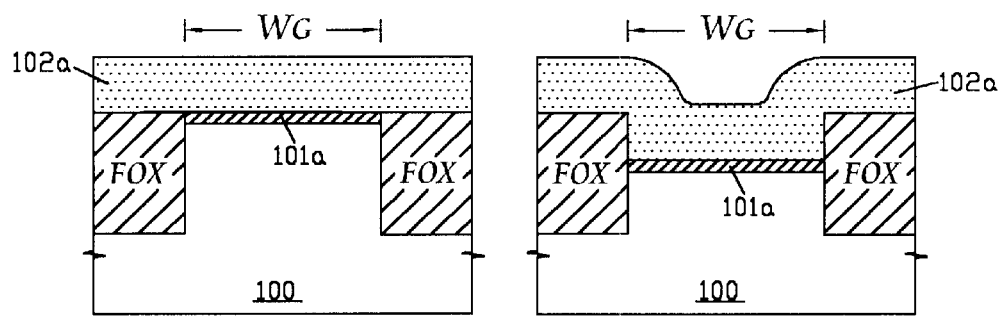
*FIG.1C(a)*
*(PRIOR ART)*
*FIG.1C(b)*
*(PRIOR ART)*

METHODS OF FABRICATING SCALED MOSFETS

BACKGROUND OF THE INVENTION

1. Field of the Invention

The present invention relates generally to metal-oxide-semiconductor field-effect transistors, and more particularly to scaled metal-oxide-semiconductor field-effect transistors (MOSFETs) and their fabrication methods.

2. Description of Related Art

It is well-known that the metal-oxide-semiconductor field-effect transistors (MOSFETs) including an n-channel MOSFET and a p-channel MOSFET in CMOS integrated circuits are scaled down very rapidly, based on the scaling rule in order to gain density *speed-power product. Basically, the surface dimensions of a device including device channel-length and device channel-width can be directly scaled down by using an advanced lithographic technique, and the isolation and contact areas of a device must also be scaled down accordingly in order to increase the packing density of an integrated-circuit. From device physics, the gate-oxide thickness and the source/drain Junction depth are scaled, the lightly-doped drain (LDD) structure is used to reduce the drain-induced barrier lowering (DIBL) and hot-carrier degradation effects, and a deeper channel implant or a pocket (halo) implant using a larger-angle-tilt implantation is used to form the punch-through stop. For a shallow source/drain contact, a barrier-metal layer over a silicided source/drain diffusion region is used. Moreover, the shallow-trench-isolation (STI) instead of the local oxidation of silicon (LOCOS) is used to reduce the isolation area of a device.

Basically, based on the gate structure used in the prior arts, there are polycide-gate land salicide-gate structures. FIG. 1A shows a cross-sectional view of a polycide-gate structure in the channel-length direction, in which a tungsten-silicide layer 103a capping on a doped polycrystalline-silicon layer 102a as a gate metal is formed on a thin gate-dielectric layer 101a; a masking silicon-nitride layer 104a is formed on the tungsten-silicide layer 103a and a silicon-nitride spacer 106a is formed over the sidewalls of the patterned polycide-gate structure; a lightly-doped source/drain diffusion region 105a is formed after patterning the polycide-gate structure and a deeper heavily-doped source/drain diffusion region 107a is formed after forming a silicon-nitride spacer 106a; a self-aligned silicide layer 108a is formed over a deeper heavily-doped source/drain diffusion region 107a.

FIG. 1B shows a cross-sectional view of a salicide-gate structure in the channel-length direction, in which a polycrystalline-silicon gate layer 102a is formed over a thin gate-dielectric layer 101a; a dielectric spacer (oxide) 106a is formed over the sidewalls of the patterned gate structure; a lightly-doped source/drain diffusion region 105a is formed after patterning the gate structure and a heavily-doped source/drain diffusion region 107a is formed after forming a dielectric spacer 106a; a self-aligned silicide layer 108a, 108b is simultaneously formed over the heavily-doped source/drain diffusion region 107a and the doped polycrystalline-silicon gate layer 102a. Similarly, a silicon-nitride spacer can be used instead of an oxide spacer 106a shown in FIG. 1B, however, the silicon-nitride spacer being deposited on a thin gate-dielectric layer 101a to reduce the stress-induced defects resulting from the silicon-nitride spacer is favorable to eliminate the outdiffusion of boron impurities used to form the lightly-doped source/ drain diffusion region 105a for a p-channel MOSFET.

Apparently, as the thin gate-dielectric layer 110a is scaled to be thinner than 30 Angstroms, the extension length of the lightly-doped source/drain diffusion region 105a shown in FIG. 1A and FIG. 1B becomes a gate leakage path of a scaled MOSFET. Moreover, the overlapping capacitance between the gate and the lightly-doped source/drain diffusion region 105a becomes larger, resulting in lower speed performance. In addition, as the gate length is scaled down below 0.25 $\mu$m, the resistance of a narrow gate line becomes higher and the sheet resistance of either polycide gate or salicide gate may also depend on geometries of the gate line due to the agglomeration of the silicide layer, resulting in a higher parasitic resistance for gate interconnection.

FIG. 1C(*a*) shows a cross-sectional view in the channel-width direction, in which a polycrystalline-silicon gate layer 102a is formed over a flat surface formed by the field-oxides (FOX) and the thin-gate dielectric layer 101a. It is clearly seen that the trench corners of the semiconductor substrate 100 become the field-emission cathode lines for passing the tunneling current from the channel region to the gate 102a. The flat gate layer shown in FIG. 1C(*a*) is in general good for fine-line lithography of a short-gate length of scaled MOSFETs shown in FIG. 1A and FIG. 1B. FIG. 1C(*b*) shows that a step between the field-oxides (FOX) and the thin gate-dielectric layer 101a is formed and a polycrystalline-silicon layer 102a is formed over the steps with a non-uniform topography. From FIG. 1C(*b*), it is clearly seen that the field-emission due to the trench corners can be eliminated, however, a non-uniform topography of the polycrystalline-silicon gate layer is not favorable for fine-line lithography. Moreover, the polycrystalline-silicon gate layer is in general doped by ion-implantation for CMOS fabrication with different doping types for an n-channel MOSFET and a p-channel MOSFET, the non-uniform topography may produce a non-uniform doping depth, resulting in the poly-depletion effect of a scaled MOSFET, especially for a narrow gate-width device.

Based on the above description, there are several issues encountered for a scaled MOSFET. These issues include: (1) high tunneling current between the gate and the source/drain diffusion region through a thin gate-dielectric layer; (2) high parasitic capacitance between the gate and the source/drain diffusion region; (3) high gate-interconnection resistance of a non-planarized conductive gate layer for fine-line lithography; and (4) field-emission through the trench corners of the semiconductor substrate to the gate.

SUMMARY OF THE INVENTION

Accordingly, the present invention discloses scaled MOSFETs and their fabrication methods, in which scaled MOSFETs are formed on a flat shallow-trench-isolation structure. The flat shallow-trench-isolation structure includes an active region having a first conductive gate layer formed over a thin gate-dielectric layer and an isolation region being filled with planarized field-oxides. The first conductive gate layer is made of amorphous-silicon or polycrystalline-silicon and is implanted with doping impurities having a dopant type opposite to that of the semiconductor substrate through a first masking dielectric layer. A thin conductive barrier-metal layer is formed over the flat shallow-trench-isolation structure. The thin conductive barrier-metal layer is preferably a refractory metal-nitride layer such as a titanium-nitride layer. For the first group of scaled MOSFETs, a metal layer is formed over the thin conductive barrier-metal layer and a second masking dielectric layer is formed over the metal layer for forming a composite-gate structure. The metal layer is preferably made of a high melting-point metal such as tungsten. Apparently, the conductive barrier-metal layer is used to prevent the interaction between the first conductive gate layer and the metal layer so that a high-conductivity nature of the metal layer can be maintained. For the second group of scaled MOSFETs, a, second conductive gate layer is formed over the conductive barrier-metal layer for forming a salicide-gate structure and is preferably made of polycrystalline-silicon or amorphous-silicon. Similarly, the conductive barrier-metal layer is used to present the agglomeration of the silicide layer during a self-aligned silicidation of the second conductive gate layer.

For the first group of scaled MOSFETs, a stack-layer structure is formed above the flat shallow-trench-isolation structure, which includes a second masking dielectric layer over the metal layer over the conductive barrier-metal layer, is patterned and anisotropically etched to form a gate line. A first dielectric spacer preferably made of silicon-nitrides is formed over the sidewalls of the patterned stack-layer structure to encapsulate the metal layer and also to define the extended length of the first conductive gate layer for both sides of the gate line. The planarized field-oxides in the isolation region are etched back to a depth slightly smaller than a thickness of the first conductive gate layer and then the first conductive gate layer is anisotropically etched either vertically to form a steep-gate structure for the first embodiment of a scaled MOSFET of the present invention or anisotropically to form a taper-gate structure for the second embodiment of a scaled MOSFET of the present invention. A thermal oxidation process is performed to form a first thin poly-oxide layer over the sidewalls of the first conductive gate layer having either a steep-gate structure or a taper-gate structure and a thicker oxide layer over each side portion of the active region having a grade gate-oxide layer near the gate edges of the first conductive gate layer. A shallow moderately-doped source/drain diffusion region is formed in a self-aligned manner by implanting a moderate-dose of doping impurities having a dopant type opposite to that of the semiconductor substrate into each side portion of the active region. Subsequently, a pocket (halo) implant is performed by implanting doping impurities either vertically or with a large-angle-tilt to form the punch-through stops in the semiconductor substrate and the dopant type of the implanted doping impurities is the same as that of the semiconductor substrate. The second dielectric spacer preferably made of silicon-nitrides is formed over the sidewalls of the formed gate structure and, subsequently, a heavily-doped source/drain diffusion region is formed in a self-aligned manner by implanting a high-dose of doping impurities having a dopant type opposite to that of the semiconductor substrate into each side portion of the active region. A rapid thermal annealing process is then performed to redistribute the implanted doping impurities in the semiconductor substrate, and the extension of the shallow moderately-doped source/drain diffusion region is controlled to be extended just under the graded gate-oxide layer for either the steep-gate structure or the taper-gate structure to eliminate or reduce the tunneling current between the first conductive gate layer and the shallow moderately-doped source/drain diffuision region. Apparently, the overlapping capacitance between the first conductive gate layer and the shallow moderately-doped source/drain diffusion region can be much reduced. The thicker oxide layer outside of the second dielectric spacer is then removed by either wet-chemical dip or anisotropic dry etching to form a self-aligned source/drain contact hole and a self-aligned silicide layer is subsequently formed by a well-known self-aligned silicidation process.

For the second group of scaled MOSFETs, a second masking dielectric layer is deposited over the second conductive gate layer, the second conductive gate layer and the conductive barrier-metal layer are patterned by a masking photoresist step to define a gate region of a scaled MOSFET and a gate interconnection and are etched vertically, and the planarized field-oxides in the isolation region are subsequently etched back to a depth slightly smaller than a thickness of the first conductive gate layer and then the first conductive gate layer is anisotropically etched either vertically to form a steep-gate structure for the third embodiment of a scaled MOSFET of the present invention or a taper-gate structure for the fourth embodiment of a scaled MOSFET of the present invention. A thermal oxidation process is performed to form a second thin poly-oxide layer over the sidewalls of the second conductive gate layer, a first thin poly-oxide layer over the sidewalls of the first conductive gate layer for either the steep-gate structure or the taper-gate structure, and a thicker oxide layer over each side portion of the active region having a graded gate-oxide layer formed near the gate edges of the first conductive gate layer. A shallow moderately-doped source/drain diffusion region is formed in a self-aligned manner by implanting a moderate dose of doping impurities hiving a dopant type opposite to that of the semiconductor substrate into each side portion of the active region and also into the second conductive gate layer. Subsequently, a pocket (halo) implant is performed by implanting doping impurities either vertically or with a large-angle-tilt to form the punch-through stops in the semiconductor substrate and the dopant type of the implanted doping impurities is the same as that of the semiconductor substrate, then the second masking dielectric layer is removed. A first dielectric spacer preferably made of silicon-nitrides is formed over he sidewalls of the formed gate structure and, subsequently, a deeper heavily-doped source/drain diffusion region is formed in a self-aligned manner by implanting a high-dose of doping impurities having a dopant type opposite to that of the semiconductor substrate into each side portion of the active region and also into the second conductive gate layer. A rapid thermal annealing process is then performed to redistribute the implanted doping impurities in either the semiconductor substrate or the second conductive gate layer, and the extension of the shallow moderately-doped source/drain diffusion region is controlled to be extended just under the graded gate-oxide layer for either the steep-gate structure or the taper-gate structure to eliminate or reduce the tunneling current between the first conductive gate layer and the shallow moderately-doped source/drain diffusion region. Similarly, the overlapping capacitance between the first conductive gate layer and the shallow moderately-doped source/drain diffusion region can be much reduced. A two-step self-aligned silicidation process is used to completely convert the second conductive gate layer into a thick silicide layer and to form a thin silicide layer over the shallow heavily-doped source/drain diffusion region. Apparently, a high-conductivity gate layer for gate interconnection can be obtained for a scaled MOSFET of the present invention as compared to the salicide gate of the prior arts.

BRIEF DESCRIPTION OF THE DRAWINGS

FIG. 1A through FIG. 1C show the cross-sectional views for a scaled MOSFET of the prior art, in which FIG. 1A shows a cross-sectional view of a polycide-gate MOSFET in the channel-length direction; FIG. 1B shows a cross-sectional view of a salicide-gate MOSFET in the channel-length direction; FIG. 1C(a) shows a cross-sectional view of a scaled MOSFET in the channel-width direction for a shallow-trench-isolation structure having a flat polycrystalline-silicon gate layer; and FIG. 1C(b) shows a cross-sectional view of a scaled MOSFET in the channel-width direction for a shallow-trench-isolation structure having a non-planarized polycrystalline-silicon gate layer;

FIG. 2A through FIG. 2F show the cross-sectional views for scaled MOSFETs of the present invention, in which FIG. 2A shows a cross-sectional view of a scaled metal-gate MOSFET having a steep-gate structure; FIG. 2B shows a cross-sectional view of a scaled metal-gate MOSFET having a taper-gate structure; FIG. 2C shows a cross-sectional view of a sealed salicide-gate MOSFET having a steep-gate structure; FIG. 2D show s a cross-sectional view of a scaled salicide-gate MOSFET having a taper-gate structure; FIG. 2E shows a cross-sectional view of a scaled metal-gate MOSFET in the channel-width direction for a flat shallow-trench-isolation structure; and FIG. 2F shows a cross-sectional view of a scaled salicide-gate MOSFET in the channel-width direction for a flat shallow-trench-isolation structure;

DETAILED DESCRIPTION OF THE PREFERRED EMBODIMENTS

Figure 2A:
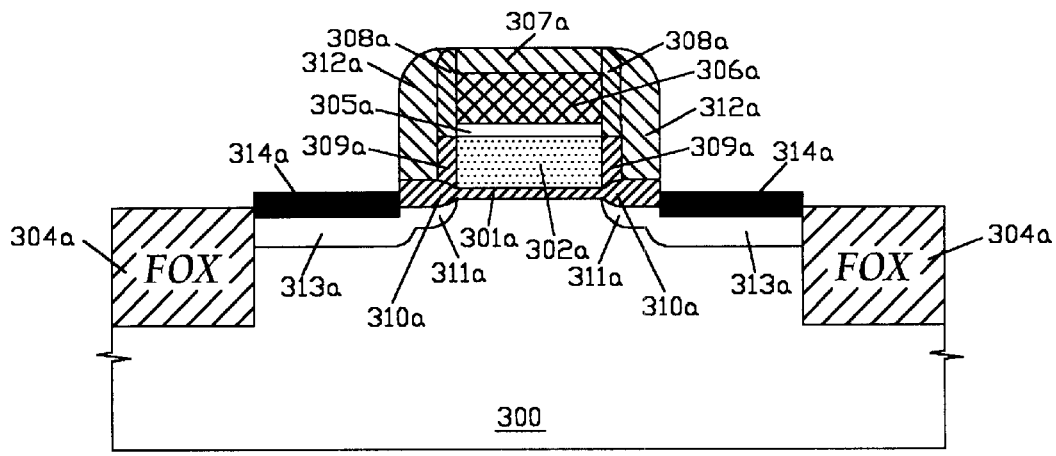

Referring now to FIG. 2A through FIG. 2D, there are shown the cross-sectional views of scaled MOSFETs in the channel-length direction for the four embodiments of the present invention. FIG. 2A shows the first embodiment the present invention, in which a stack-gate structure including a conductive barrier-metal layer 305a being sandwiched between a metal layer 306a on the top and a first conductive gate layer 302a at the bottom is formed over a thin gate-dielectric layer 301a; a second masking dielectric layer 307a is formed on the top of the metal layer 306; a first dielectric spacer 308a is formed over the sidewalls of the second masking dielectric layer 307a, the metal layer 306a, and the conductive barrier-metal layer 385a; a first poly-oxide layer 309a is formed over the sidewalls of the first conductive gate layer 302a; and a graded gate-oxide layer 310a is formed near the gate edges of the semiconductor substrate 300. The shallow moderately-doped source/drain diffusion region 311a is formed in each side portion of the active region and is located under the graded gate-oxide layer 310a. A second dielectric spacer 312a is formed over the sidewalls of the first dielectric spacer 308a and the first poly-oxide layer 309a and is also formed on the graded gate-oxide layer 310a. A deeper heavily-doped source/drain diffusion region 313a is formed in each side portion of the active region, and a self-aligned silicide layer 314a is formed over the deeper heavily-doped source/drain diffusion region 313a between the field-oxides (FOX) 304a and the second dielectric spacer 312a. Note that the shad w moderately-doped source/drain diffusion region 311a is implanted by aligning to the first dielectric spacer 308a and the deeper heavily-doped source/drain diffusion region 313a is implanted by aligning to the second dielectric spacer 312a. The dopant type in the first conductive gate layer 302a, the shallow moderately-doped source/drain diffusion region 311a, land the deeper heavily-doped source/drain diffusion region 313a is opposite to that of the semiconductor substrate 300. The semiconductor substrate 300 can be an n-well or a p-well. It is clearly seen that the metal layer 306a is encapsulated by the second masking dielectric layer 307a on the top, the first dielectric spacer 308a on both sides, and the conductive barrier-metal layer 305a at the bottom and, therefore, a high conductivity nature of the metal layer 306a can be preserved and no interaction between the metal layer 306a and the first conductive gate layer 302a would be occurred. Moreover, the field-emission and the overlapping capacitance between the first conductive gate layer 302a and the extended portion of the shallow moderately-doped source/drain diffusion region 311a can be minimized without shortening the channel length as compared to the gate length.

Figure 2B:
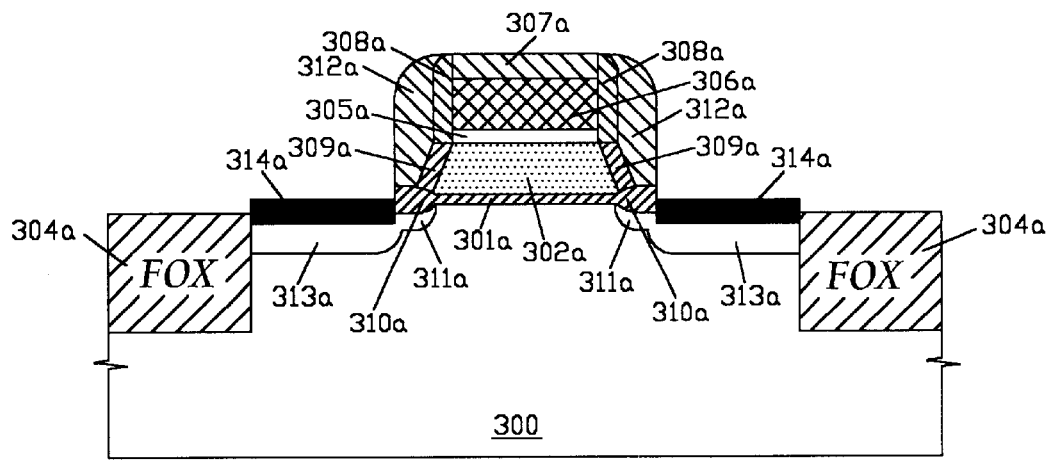

FIG. 2B shows the second embodiment of the present invention, in which the first conductive gate layer 302a is etched to have a taper-gate structure and a first poly-oxide layer 309a is formed over the sloped sidewalls. Compared FIG. 2B with FIG. 2A, it is clearly seen that the effective channel length of FIG. 2B is slightly longer than that of FIG. 2A and the series resistance due to the shallow moderately-doped source/drain diffusion region of FIG. 2B is slightly smaller than that of FIG. 2A. Therefore, FIG. 2B may offer larger punch-through voltage and smaller drain-induced barrier lowering effect as compared to those of FIG. 2A. The other advantages exhibited by FIG. 2A are still preserved for FIG. 2B.

Figure 2C:
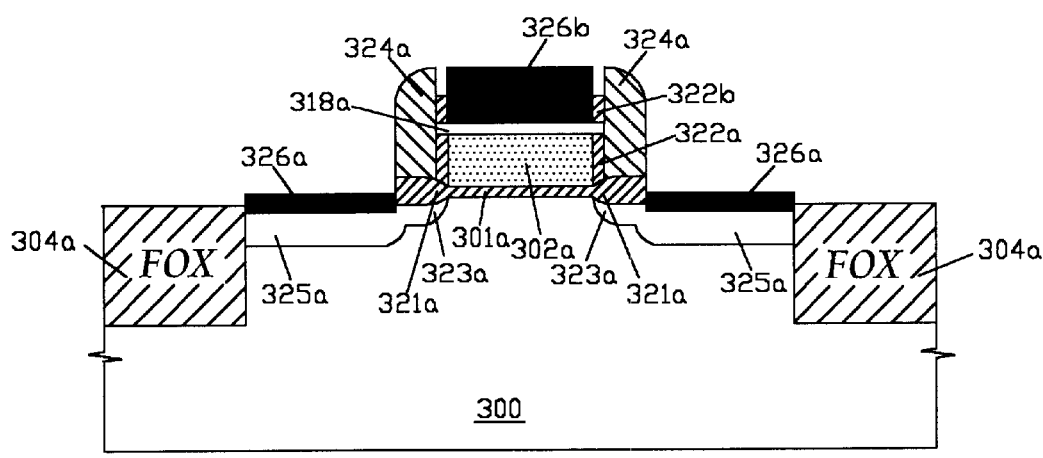

FIG. 2C shows the third embodiment of the present invention, in which a conductive barrier-metal layer 318a is sandwiched between a thick silicide layer 326b on the top and a first conductive gate layer 302a at the bottom; a first poly-oxide layer 322a is formed over the sidewalls of the first conductive gate layer 302a having been etched with a steep-gate structure; a second poly-oxide layer 322b is partially remained on the sidewalls of the thick silicide layer 326b. The shallow moderately-doped source/drain diffusion region 323a is implanted by aligning to the first and second poly-oxide layers 322a, 322b formed over the sidewalls of the first and second conductive gate layer 302a, 319a (not shown), respectively, and is located under the graded gate-oxide layer 321a; a deeper heavily-doped source/drain diffusion region 325a is implanted by aligning to the first dielectric spacer 324a. It should be noted that the thick silicide layer 326b is formed by completely converting a second conductive gate layer 319a into a thick silicide layer using a two-step self-aligned silicidation process. The first-step self-aligned silicidation process is used to convent the major portion of the second conductive gate layer 319a into a thicker silicide layer and the second-step self-aligned silicidation process is used to simultaneously silicide the deeper heavily-doped source/drain diffusion region 325a to form a thin salicide layer 326a and the gate region to convert the rest portion of the second conductive gate layer 319a. It is clearly seen that the conductive barrier-metal layer 318a is used to prevent the first conductive gate layer from the agglomeration and, therefore, a high conductivity nature of the thick silicide layer can be preserved. Similarly, the field emission and the overlapping capacitance between the first conductive gate layer 302a and the extended portion of the shallow moderately-doped source/drain diffusion region 323a can be minimized.

Figure 2D:
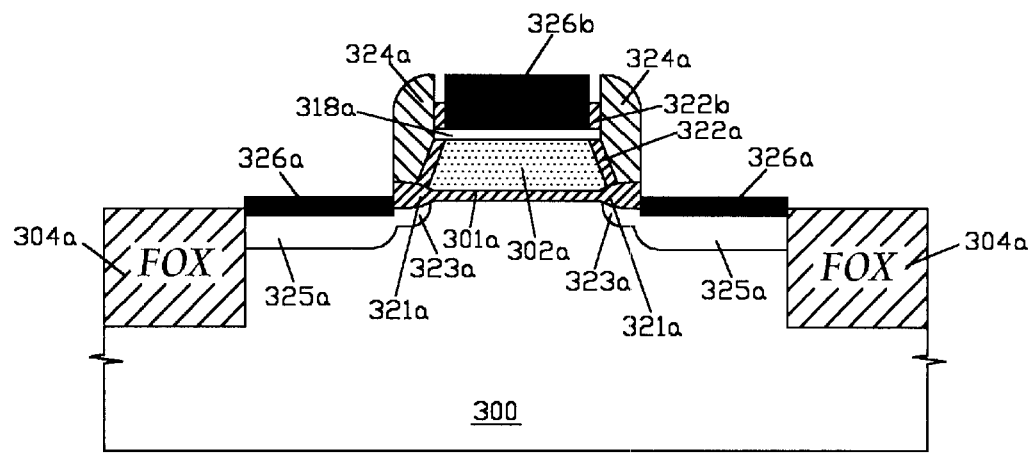

FIG. 2D shows the fourth embodiment of the present invention, in which the first conductive gate layer 302a is etched to have a taper-gate structure and a first poly-oxide layer 322a is formed over the sloped sidewalls of the first conductive gate layer 302a, as similarly shown in FIG. 2B. Basically, the major features of FIG. 2D are similar to those of FIG. 2B.

Figure 2E:
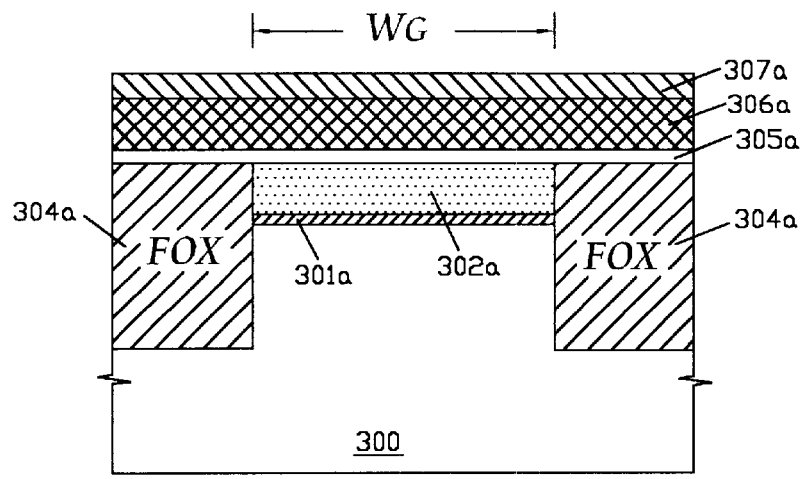
Figure 2F:
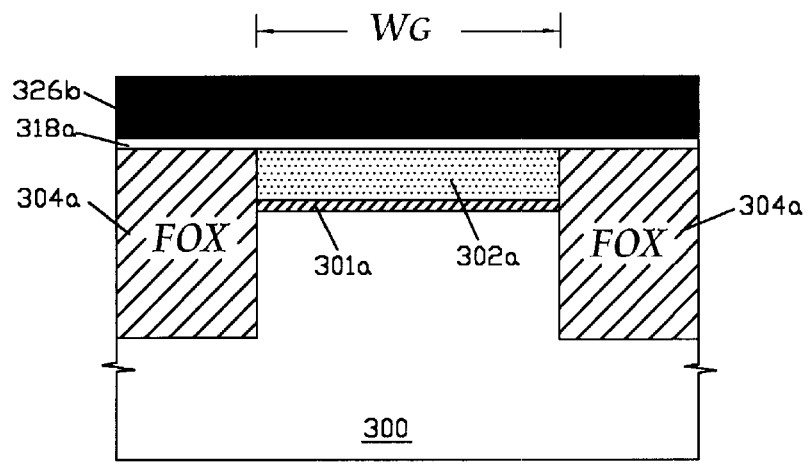

Referring now to FIG. 2E and FIG. 2F, there are shown the cross-sectional views of scaled MOSFETs in the channel-width direction. FIG. 2E shows a cross-sectional view of a scaled MOSFET in the channel-width direction for either FIG. 2A or FIG. 2B, in which a metal layer 306a over a conductive barrier-metal layer 305a is formed over a flat shallow-trench-isolation structure. The flat shallow-trench-isolation structure is formed over the semi conductor substrate 300, which includes a first conductive gate layer 302a formed over a thin gate-dielectric layer 301a and the planarized field-oxides (FOX) 304a. It is clearly seen that the field emission through the trench corners from the semiconductor substrate 300 can be completely eliminated and the flat shallow-trench-isolation structure offers a flat surface for fine-line lithography. Moreover, the planarized field-oxides shown in the channel-width direction are thicker than the planarized field-oxides shown in the channel-length direction, so the parasitic capacitance for gate interconnection is much reduced. Therefore, the RC delay of gate interconnection is much smaller than that of the prior arts. FIG. 2F shows a cross-sectional view of a scaled MOSFET in the channel-width direction for either FIG. 2C or FIG. 2D, in which a thick silicide layer 1326b over a conductive barrier-metal layer 318a is formed over the flat shallow-trench-isolation structure as stated in FIG. 2E. It is clearly seen that the features of FIG. 2E are still preserved for FIG. 2F.

According to the above description, the scaled MOSFETs of the present invention exhibit the following advantages as compared to the prior arts:

(a) A highly conductive gate layer formed over a conductive barrier-metal layer for gate interconnection is formed for scaled MOSFETs by using a metal layer or a thick silicide layer;

(b) Low gate-interconnection capacitance and elimination of the field emission between the trench corner of the semiconductor substrate and the gate are obtained by a flat shallow-trench-isolation structure;

(c) The field-emission current and the overlapping capacitance between the gate and the extended portion of the shallow moderately-doped source/drain diffusion region can be largely minimized by a graded gate-oxide layer formed over the gate edges of either a steep-gate structure or a taper-gate structure; and (d) The flat gate-layer structure is formed over the flat shallow-trench-isolation structure for fine-line lithography and the minimization of the poly-depletion effect.

Figure 3A:
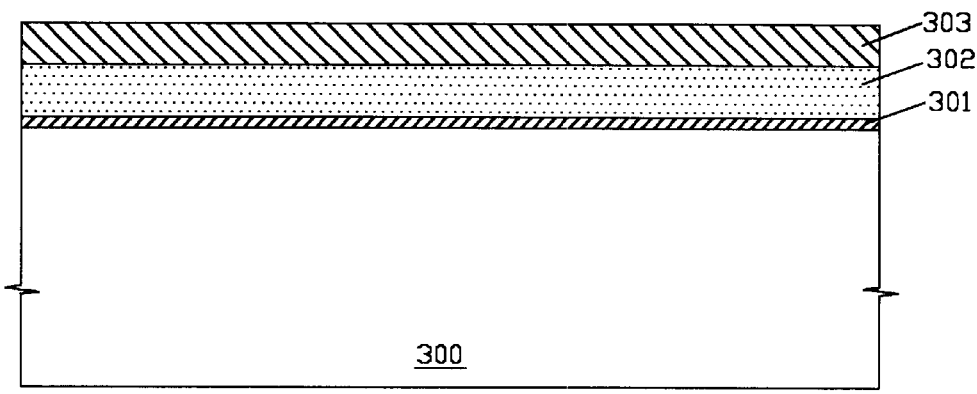
FIG. 3A through FIG. 3F show the process steps and their cross-sectional views for forming a flat shallow-trench-isolation structure over a semiconductor substrate.
Figure 3B:
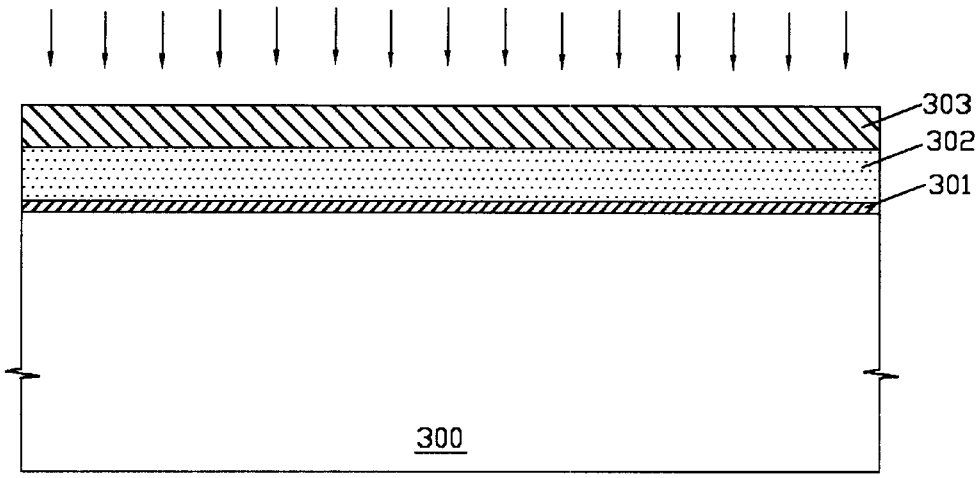
Figure 3C:
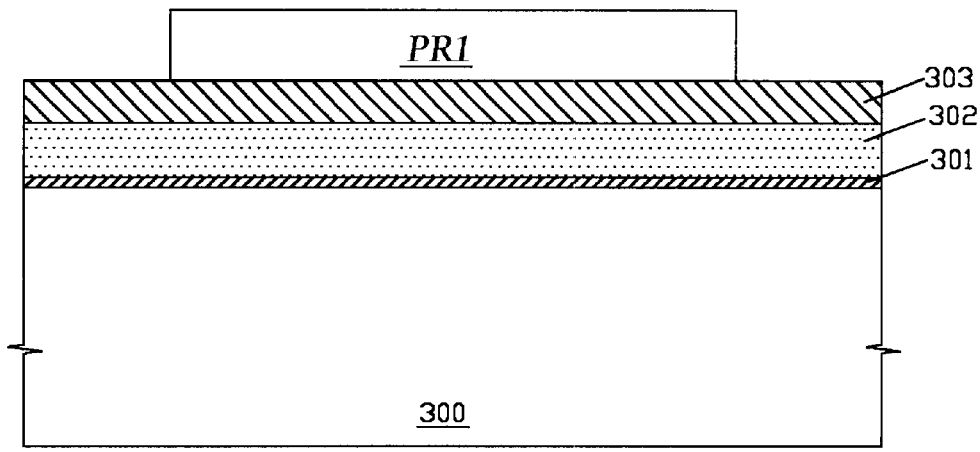

Now, the process steps for fabricating scaled MOSFETs of the present invention are described. FIG. 3A through FIG. 3F show the process steps and their cross-sectional views for forming a flat shallow-trench-isolation structure. FIG. 3A shows that a multilayer structure is formed over a semiconductor substrate 300. The multilayer structure includes a first masking dielectric layer 303 formed on the top, a first conductive gate layer 302 formed in the middle, and a thin-gate dielectric layer 301 formed at the bottom. The first masking dielectric layer 303 is preferably made of silicon-nitrides deposited by low-pressure chemical-vapor-deposition (LPCVD); the first conductive gate layer 302 is preferably made of amorphous-silicon or polycrystalline-silicon deposited by LPCVD; and the thin-gate dielectric layer 301 is preferably a thermal-oxide layer or a nitrided thermal-oxide layer. It should be noted that the semiconductor substrate 300 can be a p-well or a p-type semiconductor substrate for fabricating an n-channel MOSFET or can be an n-well or an n-type semiconductor substrate for fabricating a p-channel MOSFET. FIG. 3B shows that the first conductive gate layer 302 is implanted with a high dose of doping impurities having a dopant type opposite to that of the semiconductor substrate 300. FIG. 3C shows that a masking photoresist PR1 is patterned to define an active region or an isolation region surrounding the active region.

Figure 3D:
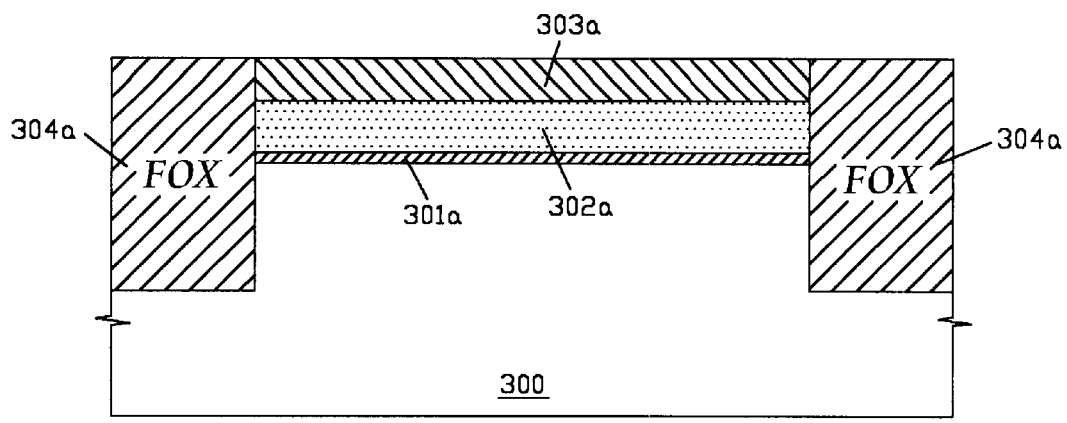

FIG. 3D shows that the multilayer structure outside of the patterned masking photoresist PR1 is anisotropically removed and subsequently the semiconductor substrate 300 is anisotropically etched to form a shallow trench. After removing the patterned masking photoresist PR1, a thick field-oxide film is deposited to fill up the gap formed over the shallow trench (not shown) and the planarization of the thick field-oxide film is performed to form planarized field-oxides (FOX) shown in FIG. 3D. The planarization i is preferably performed by using chemical-mechanical polishing (CMP) with the first masking dielectric layer 303a as a polishing stop.

Figure 3E:
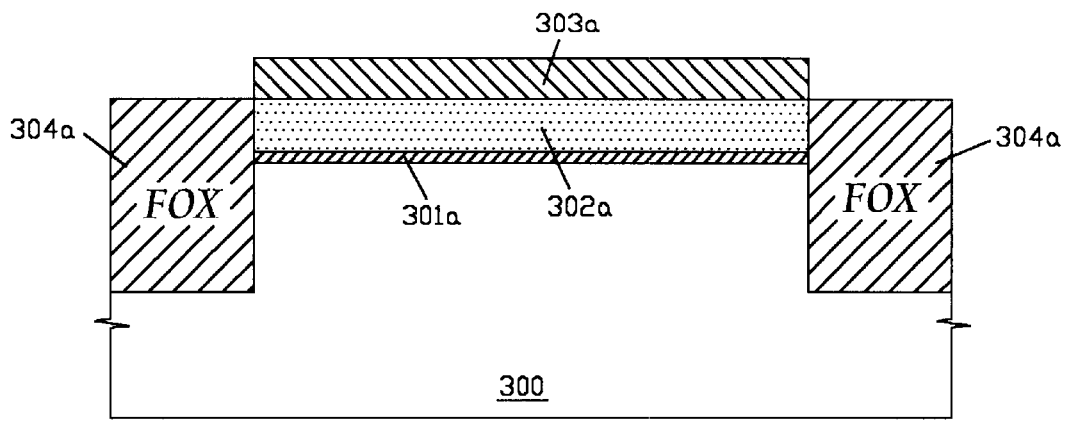
Figure 3F:
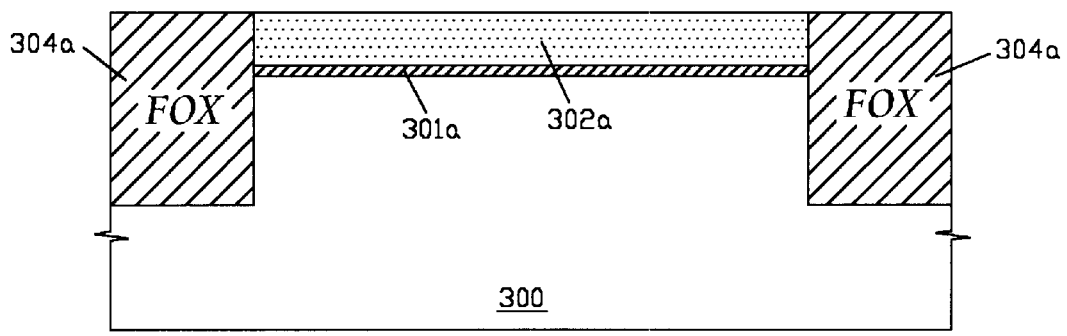

FIG. 3E shows that the planarized field-oxides 304a in FIG. 3D are etched back to a depth equal to the thickness of the first masking dielectric layer 303a. FIG.3F shows that the first masking dielectric layer 303a is removed to form a flat shallow-trench-isolation structure.

It should be noted that several other methods could be used to form the flat shallow-trench-isolation structure shown in FIG. 3F. For the first example, before depositing a thick field-oxide film to fill up the gap, a thermal oxidation process is performed to form a thin thermal-oxide layer over the trench surface to eliminate the trench etching-induced defects and a thin poly-oxide layer over the sidewall of the first conductive gate layer. These thin oxide layers together with the thin gate-dielectric layer therebetween form the integrated part of the field-oxides (FOX) 304a shown in FIG. 3F. For the second example, before anisotropically etching the shallow trench, a thin silicon-oxide spacer is formed over the sidewalls of the first masking dielectric layer 303a, the first conductive gate layer 302a, and al thin gate-dielectric layer 301a, and then the shallow-trench etching is performed. Subsequently, a thin thermal-oxide layer having a thickness approximately equal to the width of the thin silicon-oxide spacer is formed over the trench surface to eliminate the trench etching-induced defects, then the planarized field-oxides are formed. The thin silicon-oxide spacer together with the thin thermal-oxide layer form the integrated part of the field-oxides (FOX) 304a shown in FIG. 3F. Apparently, the first example will reduce the active area due to the oxidation of the trench surface. However, the second example will not reduce the active area, because the thin silicon-oxide spacer forms the extended active region for oxidation.

From FIG. 3F, it is clearly seen that the field emission due to the trench corners of the semiconductor substrate 300 can be completely eliminated and the first conductive gate layer 302a can be uniformly implanted to reduce the poly-depletion effect.

Figure 4A:
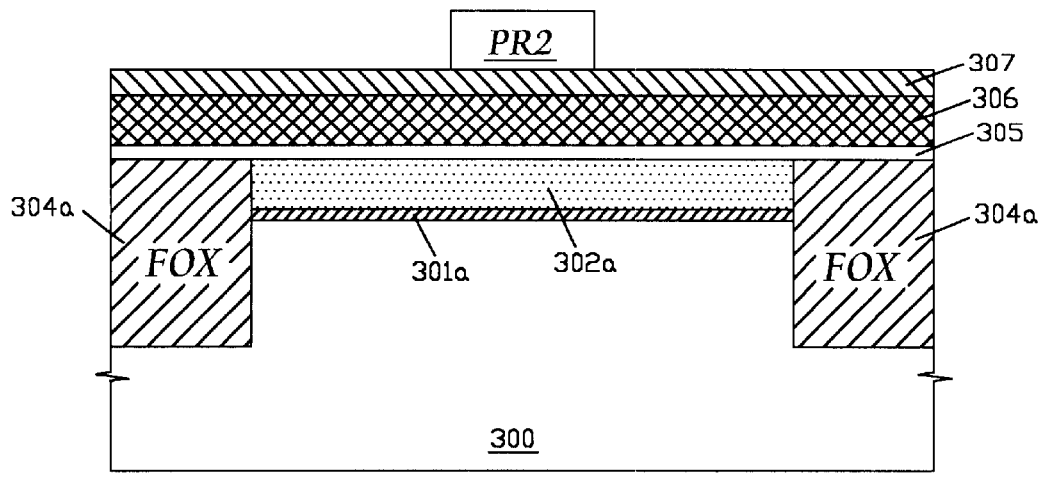
FIG. 4A through FIG. 4G show the process steps and their cross-sectional views for fabricating scaled metal-gate MOSFETs of the present invention on a flat shallow-trench-isolation structure having a steep-gate structure and a taper-date structure.

Referring now to FIG. 4A through FIG. 4G, there are shown the process steps and their cross-sectional views for fabricating scaled MOSFETs having a metal layer formed over a conductive barrier-metal layer for gate interconnection. FIG. 4A shows that a conductive barrier-metal layer, 305 is formed over the flat shallow-trench-isolation structure as shown in FIG. 3F, a metal layer 306 is formed over the conductive barrier-metal layer 305, a second masking dielectric layer 307 is formed over the metal layer 306, and a patterned masking photoresist PR2 is formed over the second masking dielectric layer 307 to define a gate line. The conductive barrier-metal layer 305 is preferably a refractory metal-nitride layer such as titanium-nitride (TiN); the metal layer 306 is preferably a high melting-point metal such as tungsten (W) or a silicide layer such as tungsten silicide (WSi$_2$); the second masking dielectric layer 307 is preferably a silicon-nitride layer or an oxynitride layer.

Figure 4B:
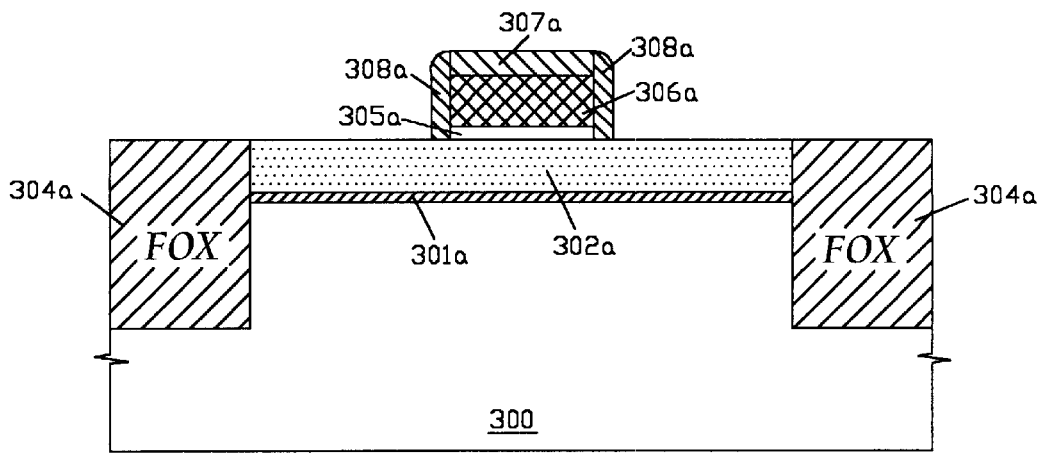

FIG. 4B shows that a gate line is formed by anisotropically etching the second masking dielectric layer 307, the metal layer 306, and the conductive barrier-metal layer 305 in sequence, then a first dielectric spacer 308a is formed over the etched sidewalls. The first dielectric spacer 308a is preferably made of silicon-nitrides deposited by LPCVD.

Figure 4C:
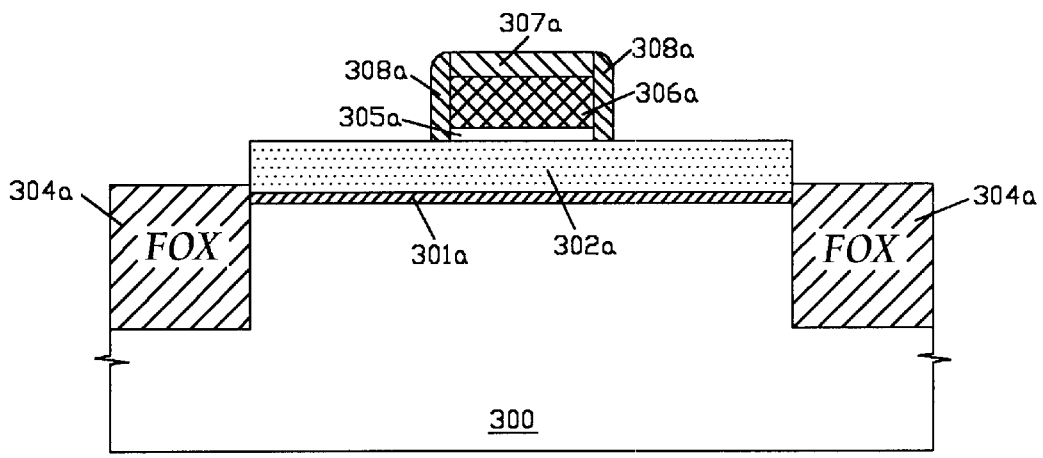
Figure 4D:
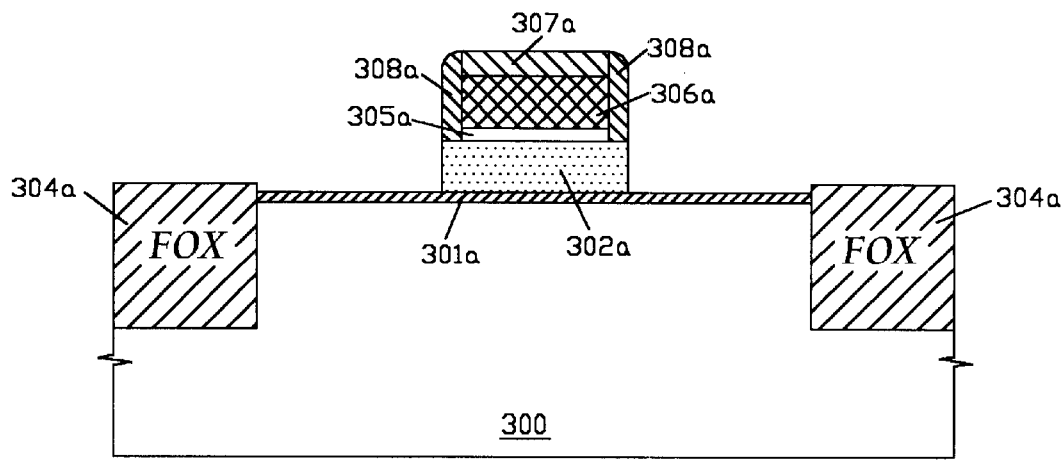
Figure 4D:
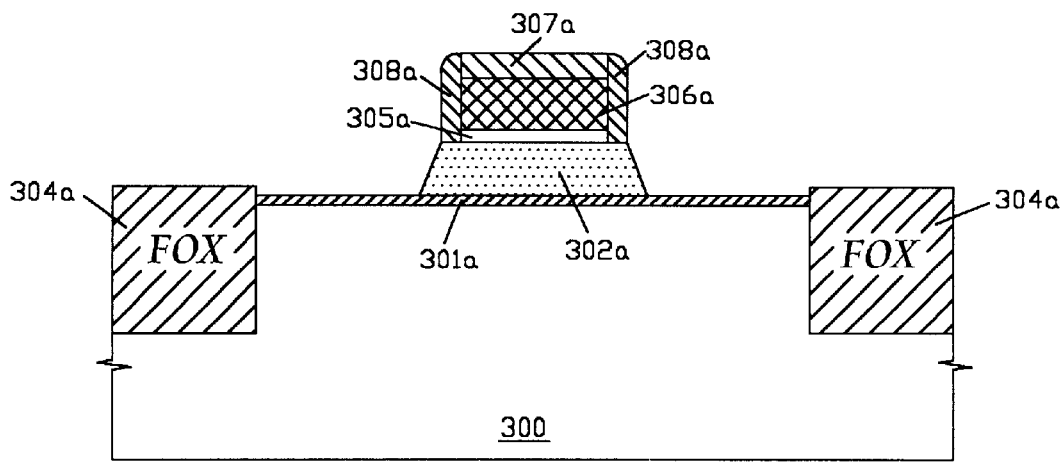

FIG. 4C shows that the planarized field-oxides 304a outside of the gate line are etched back to a depth slightly smaller than the thickness of the first conductive gate layer 302a. Then, the first conductive gate layer 302a is etched either vertically to form a steep-gate structure as shown in FIG. 4D(a) or anisotropically to form a taper-gate structure as shown in FIG. 4D(b).

Figure 4E:
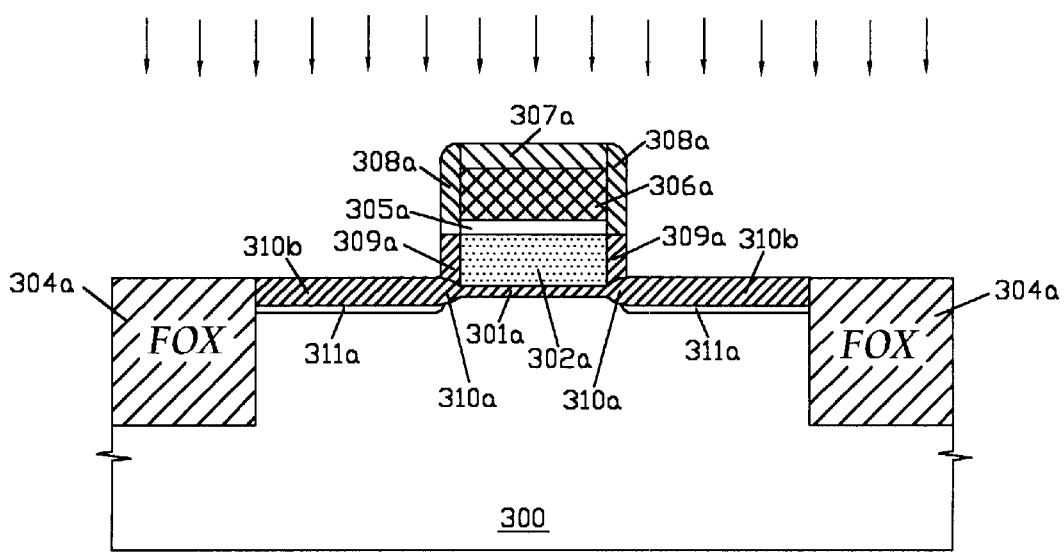
Figure 4E:
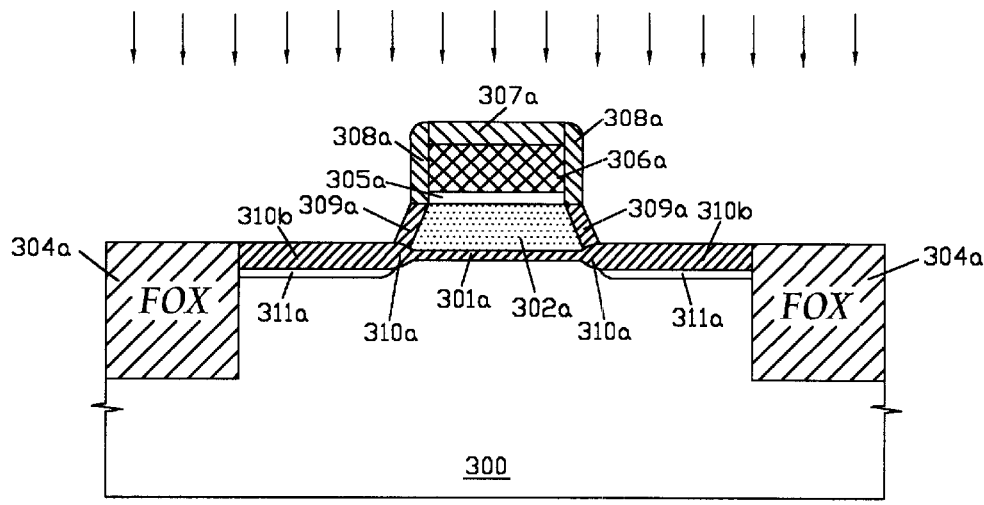

FIG. 4E(a) shows that a thermal oxidation process is performed to form a thin poly-oxide layer 309a over the sidewalls of the steep-gate structure and a thicker oxide layer 310b over each side portion of the active region with a graded gate-oxide layer 310a formed near the gate edges. A moderate dose of doping impurities with a dopant type opposite to that of the semiconductor substrate 300 is implanted into each side portion of the active region in a self-aligned manner to form a shallow moderately-doped source/drain diffusion region 311a. Similarly, FIG. 4E(b) shows that a thermal oxidation process is performed to form a thin poly-oxide layer 309a over the sloped sidewalls of the taper-gate structure and a thicker oxide layer 310b over each side portion of the active region with a graded gate-oxide layer 310a formed near the gate edges. A moderate dose of doping impurities with a dopant type opposite to that of the semiconductor substrate 300 is implanted into each side portion of the active region in a self-aligned manner to form a shallow moderately-doped source/drain diffusion region 311a. The implanted impurities are preferably arsenic for n-type dopants and preferably BF$_2^+$ for p-type dopants. From FIG. 4E(a), it is clearly seen that the first dielectric spacer 308a offers a buffer region for forming a thin poly-oxide layer 309a to be extended by self-aligned implanted impurities without shortening the effective channel length as compared to the gate length. However, it is clearly seen from FIG. 4E(b) that the first dielectric spacer 308a offers a larger effective channel length as compared to the gate length and the taper-gate structure offers a graded doping profile near the gate edges to reduce the short-channel effects. It should be noted that the pocket (halo) implant can be performed (not shown) either vertically or using a large-angle-tilt implantation to form the punch-through stops.

Figure 4F:
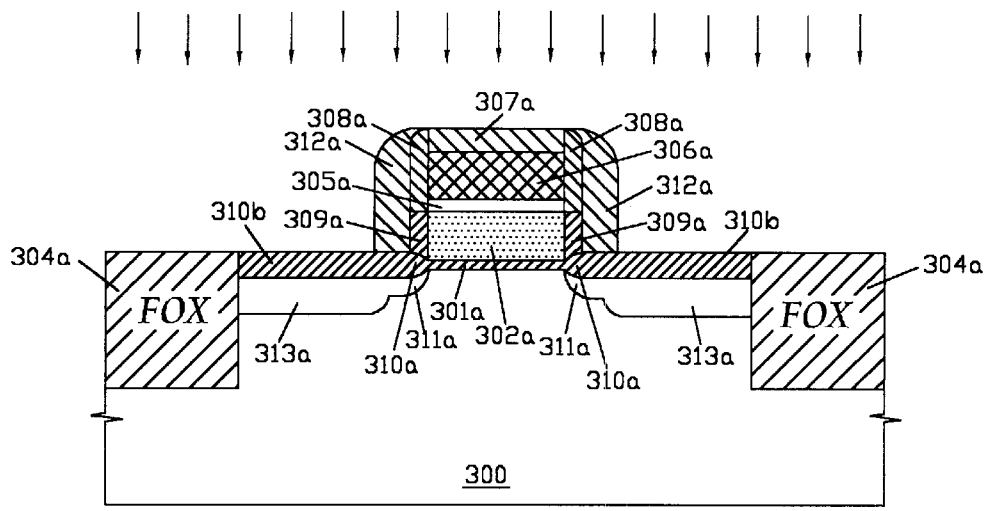
Figure 4F:
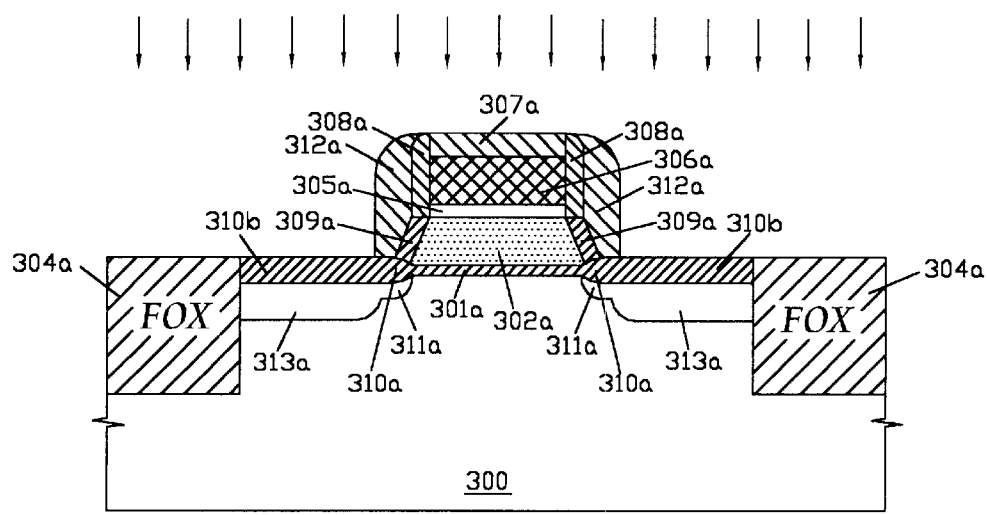

FIG. 4F(a) and FIG. 4F(b) show that a second dielectric spacer 312a is formed over the sidewalls of the first dielectric spacer 308a and the thin poly-oxide layer 309a for FIG. 4E(a) and FIG. 4E(b), respectively, and a high-dose of doping impurities with a dopant type opposite to that of the semiconductor substrate 300 is implanted into each side portion of the active region outside of the second dielectric spacer 312a to form a deeper heavily-doped source/drain diffusion region 313a, and a rapid thermal annealing (RTA) is performed to redistribute the implanted doping impurities. The second dielectric spacer 312a is preferably made of silicon-nitrides deposited by LPCVD; the implanted impurities are preferably phosphorous or arsenic for n-type dopants and preferably boron or BF$_2^+$ for p-type dopants.

Figure 4G:
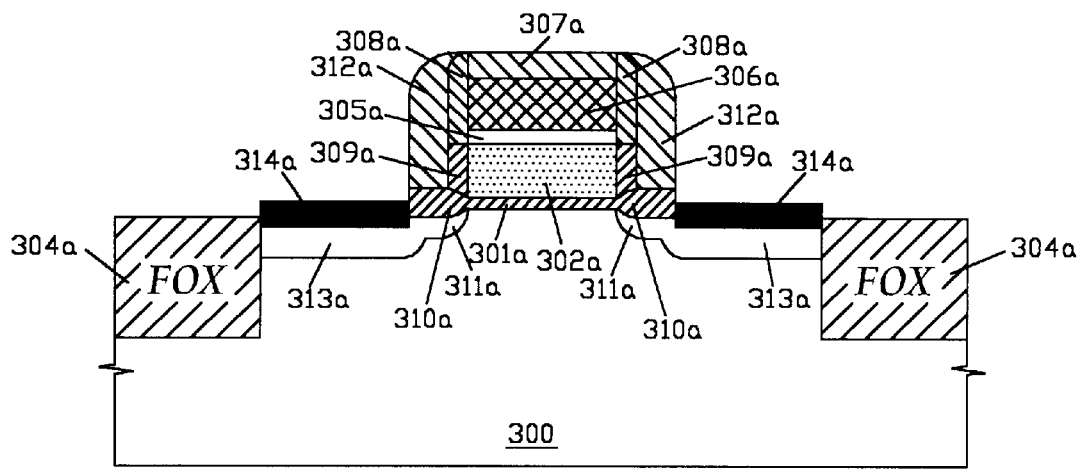
Figure 4G:
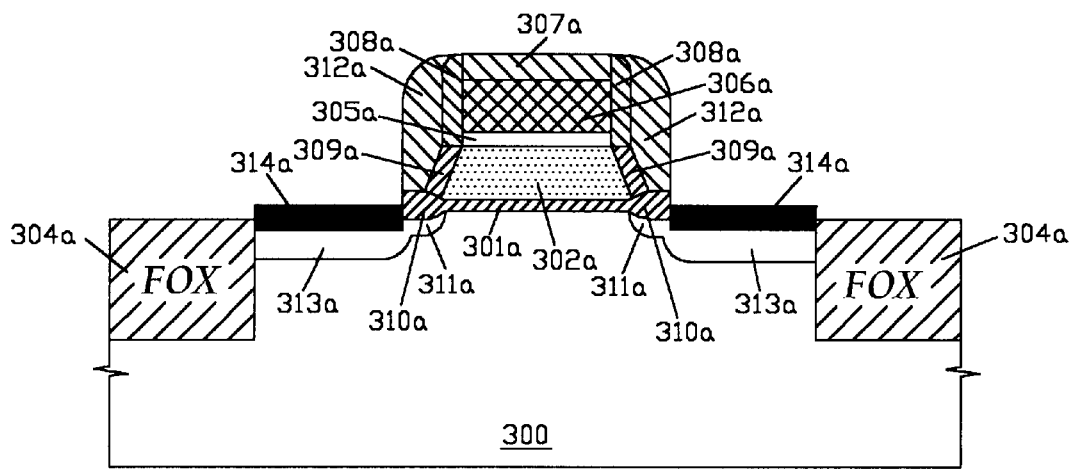

FIG. 4G(a) and FIG. 4G(b) show that a self-aligned contact hole is formed by removing the thicker oxide layer 310a and simultaneously etching the planarzied field-oxides 304a outside of the second dielectric spacer 312a and then a self-aligned silicide layer 314a is formed over the deeper heavily-doped source/drain diffusion region 313a through the formed self-aligned contact holes. The self-aligned silicide layer 314a formed is preferably a refractory metal-silicide layer such as TiSi$_2$, COSi$_2$, NiSi$_2$, TaSi$_2$, PtSi$_2$ or MoSi$_2$ etc.. FIG. 4G(a) shows the first embodiment of the present invention and is also shown in FIG. 2A; FIG. 4G(b) shows the second embodiment of the present invention and is also shown in FIG. 2B. The cross-sectional views in the channel width direction for FIG. 4G(a) and FIG. 4G(b) are shown in FIG. 2E.

Figure 5A:
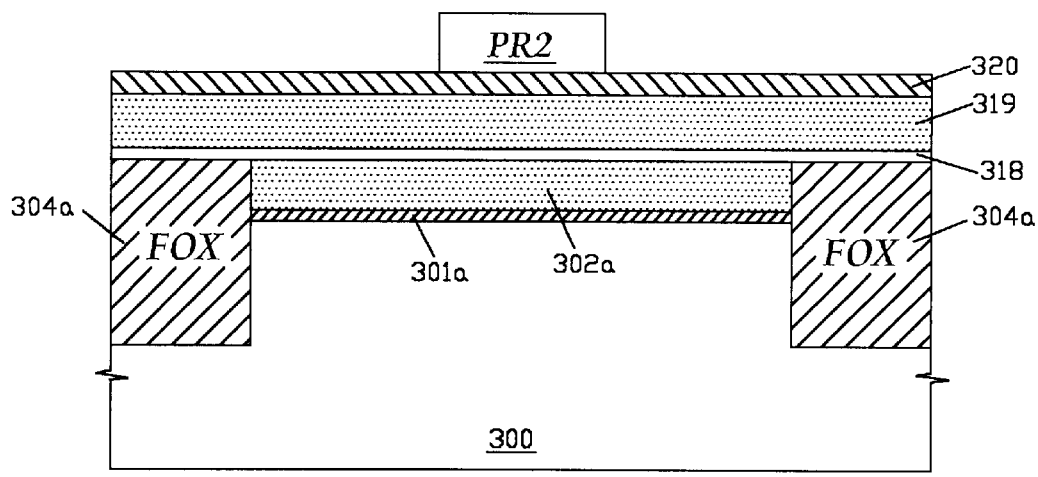
FIG. 5A through FIG. 5G show the process steps and their cross-sectional views for fabricating scaled salicide-gate MOSFETs of the present invention on a flat shallow-trench-isolation structure having a steep-gate structure and a taper-gate structure.

Referring now to FIG. 5A through FIG. 5G, there are shown the process steps and their cross-sectional views for fabricating scaled MOSFETs having a thick silicide layer formed over a conductive barrier-metal layer for gate interconnection. FIG. 5A shows that a conductive barrier-metal layer 318 is formed over the flat shallow-trench-isolation structure as shown in FIG. 3F, a second conductive gate layer 319 is formed over the conductive barrier-metal layer 318, a second masking dielectric layer 320 is formed over the second conductive gate layer 319, and a patterned masking photoresist PR2 is formed over the second masking dielectric layer 320 to define a gate line. The conductive barrier-metal layer 318 is preferably a refractory metal-nitride layer such as titanium-nitride (TiN); the second conductive gate layer 319 is preferably made of amorphous-silicon or polycrystalline-silicon deposited by LPCVD; the second masking dielectric layer 320 is preferably made of silicon-nitrides deposited by LPCVD.

Figure 5B:
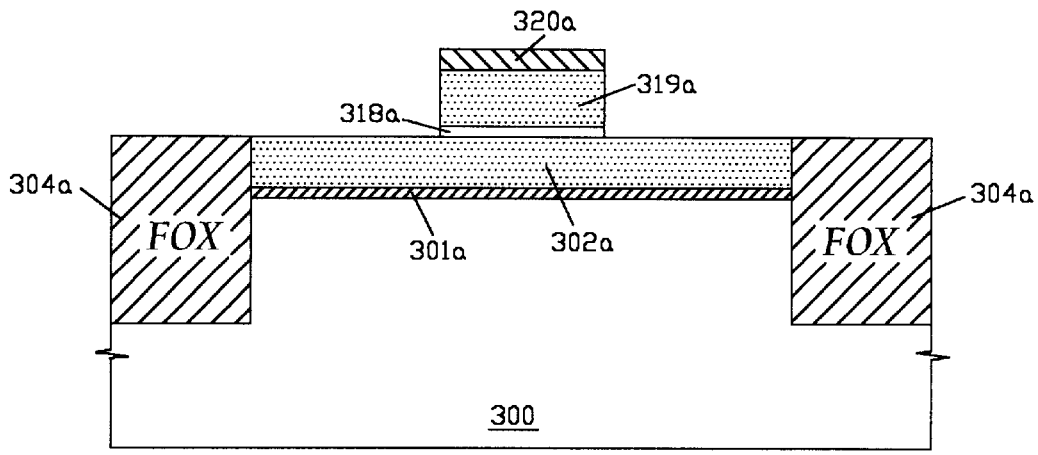

FIG. 5B shows that FIG. 5A is anisotropically etched by sequentially removing the second masking dielectric layer 320, the second conductive gate layer 319, and the conductive barrier-metal layer 318, and then the patterned masking photoresist PR2 is stripped.

Figure 5C:
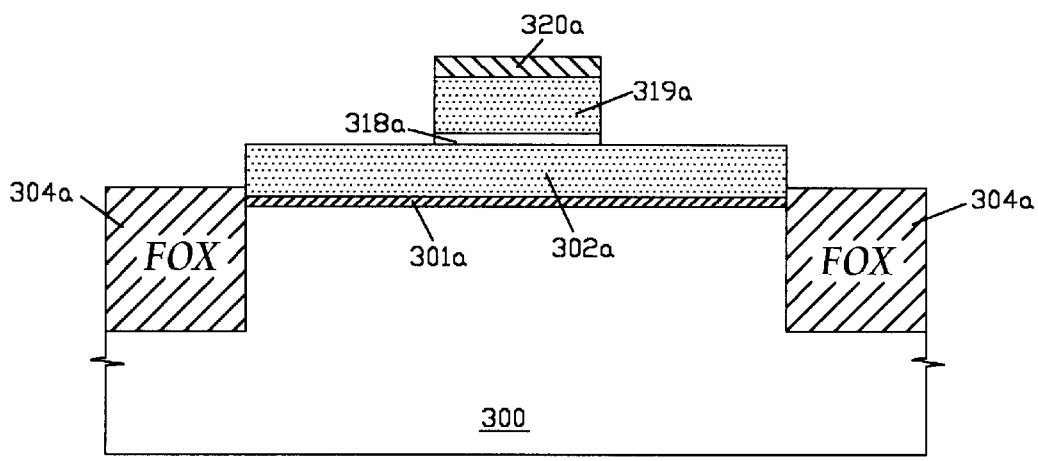

FIG. 5C shows that the planarized field-oxides (FOX) 304a outside of the gate line are etched back to a depth slightly smaller than a thickness of the first conductive gate layer 302a. Then, the first conductive gate layer 302a is etched either vertically to form a steep-gate structure as shown in FIG. 5D(a) or anisotropically to form a taper-gate structure as shown in FIG. 5D(b).

Figure 5D:
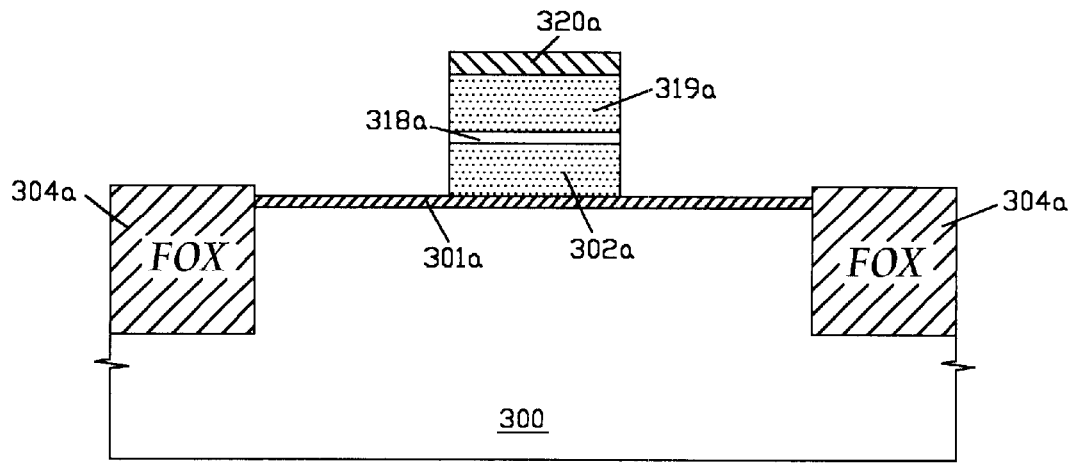
Figure 5D:
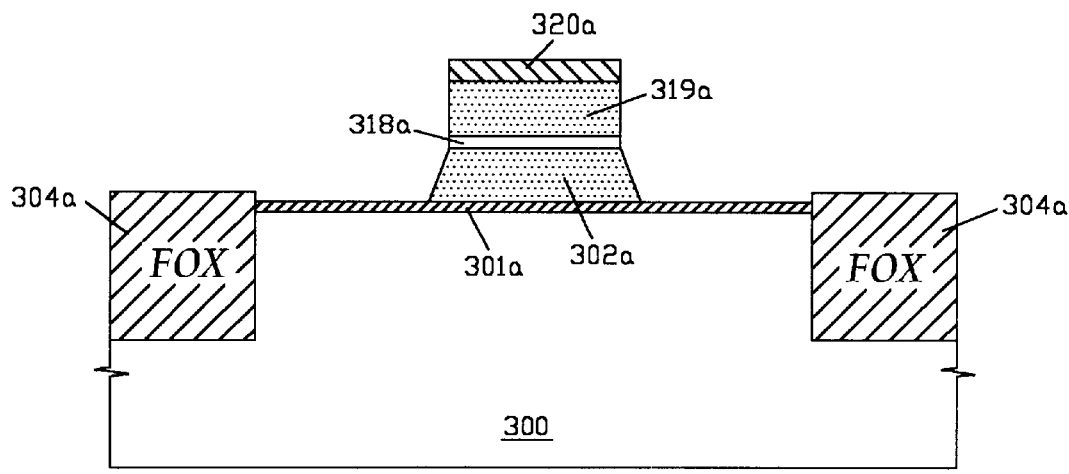
Figure 5E:
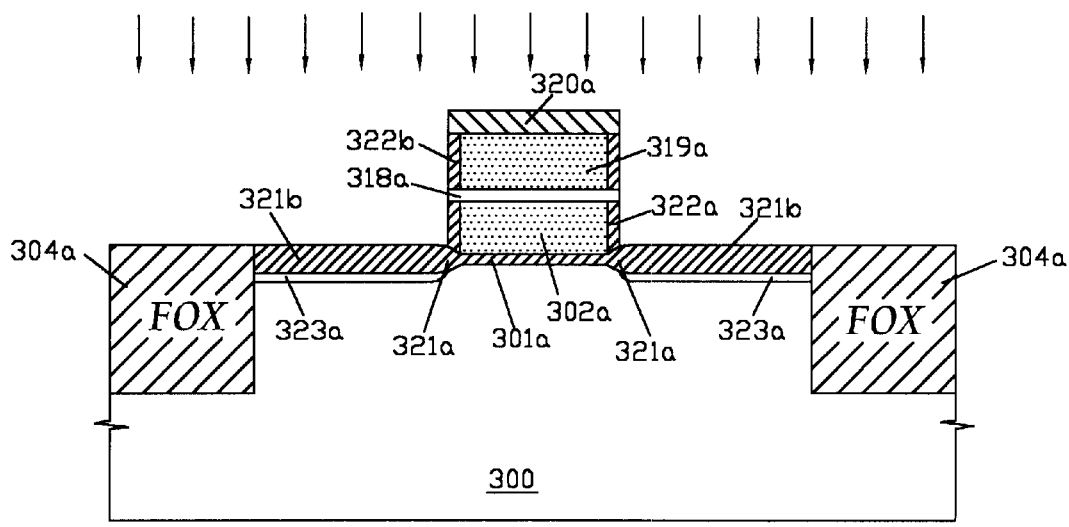
Figure 5E:
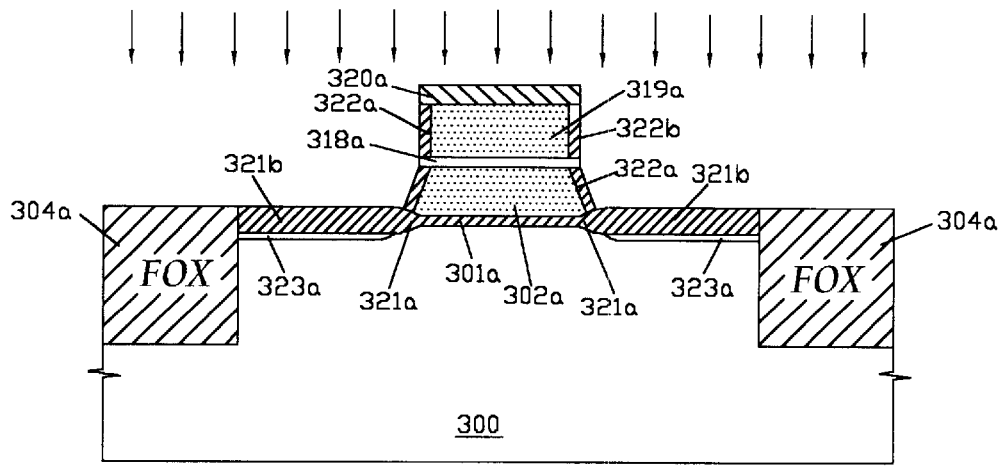

FIG. 5E(a) and FIG. 5E(b) show that FIG. 5D(a) and FIG. 5D(b) are oxidized to form a second poly-oxide layer 322b over the sidewalls of the second conductive gate layer 319a, a first poly-oxide layer 322a over the sidewalls of the first conductive gate layer 302a, a thicker oxide layer 321b over each side portion of the active region having a graded gate-oxide layer 321a near the gate edges, and a moderate dose of doping impurities with a dopant type, opposite to that of the semiconductor substrate is implanted into each side portion of the active region in a self-aligned manner to form a shallow moderately-doped source/drain diffusion region 323a. The implanted doping impurities are preferably arsenic for n-type dopants and preferably boronfluoride cation (BF$_2^+$) for p-type dopants.

Figure 5F:
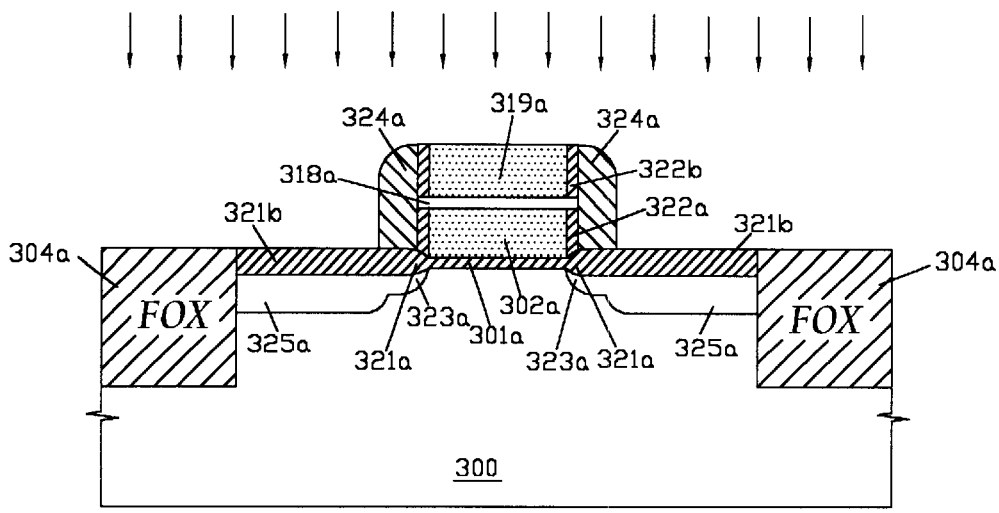
Figure 5F:
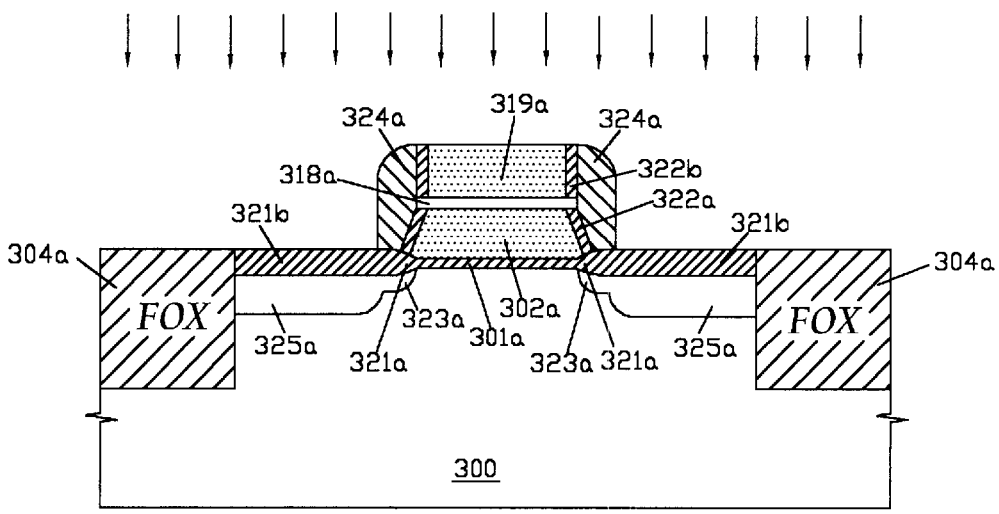

FIG. 5F(a) and FIG. 5F(b) show that the second masking dielectric layer 320a is selectively removed, a first dielectric spacer 324a is then formed over the sidewalls of the oxidized gate line, and subsequently a high-dose of doping impurities with a dopant type opposite to that of the semiconductor substrate 300 is implanted into each side portion of the active region outside of the first dielectric spacer 324a to form a deeper heavily-doped source/drain diffusion region 325a. The first dielectric spacer 324a is preferably made of silicon-nitrides deposited by LPCVD; the implanted doping impurities are preferably arsenic or phosphorous for n-type dopants and preferably boron or boronfluoride cation ($BF_2^+$) for p-type dopants. A rapid thermal annealing is performed to redistribute the doping impurities in the semiconductor substrate 300. Note that a very thin poly-oxide layer can be formed over the second conductive gate layer 319a by thermal oxidation after removing the second masking dielectric layer 320a. It should be emphasized that the graded gate-oxide layer 321a offers a buffer region for forming the extension region of the shallow moderately-doped source/drain diffusion region 323a after a rapid-thermal-annealing process, so that the field emission and the overlapping capacitance between the first conductive gate layer 302a and the shallow moderately-doped source/drain diffusion region 323a can be minimized.

Figure 5G:
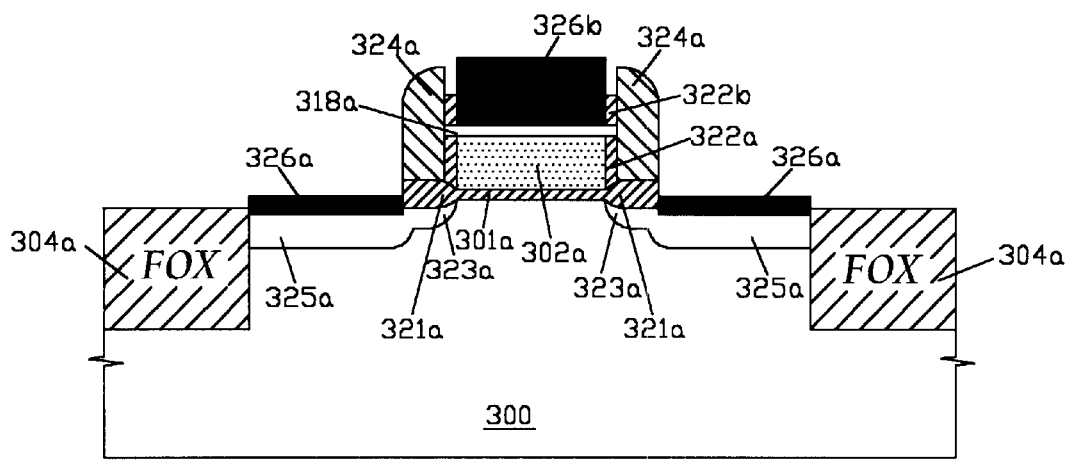
Figure 5G:
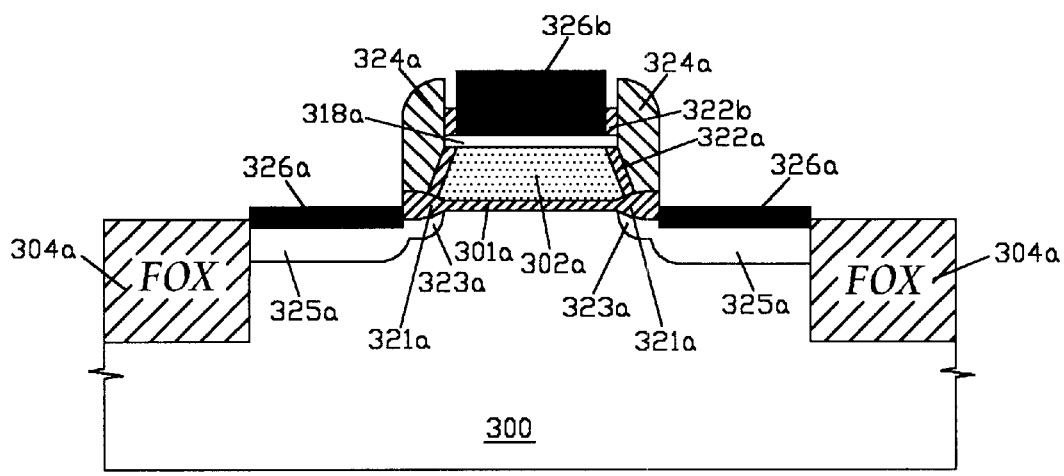

FIG. 5G(a) and FIG. 5G(b) show that the second conductive gate layer 319a shown in FIG. 5F(a) and FIG. 5F(b) are completely converted into a thick silicide layer 326b and a thin silicide layer 326a is formed over the deeper heavily-doped source/drain diffusion region 325a outside of the first dielectric spacer 324a. A two-step self-aligned silicidation process is performed to obtain the silicide structures shown in FIG. 5G(a) and FIG. 5G(b). The first-step self-aligned silicidation process is that after removing a thin poly-oxide layer over the top of the second conductive gate layer 319a, a thicker refractory-metal layer is deposited over the structures shown in FIG. 5F(a) and FIG. 5F(b), and then a rapid-thermal-annealing process in a nitrogen or argon ambient is performed to convert the major part of the second conductive gate layer 319a into a thick silicide layer and the unreacted refractory-metal layer is removed. The second-step self-aligned silicidation process is that a self-aligned source/drain contact hole is formed over the deeper heavily-doped source/drain diffusion region 325a, a thin refractory-metal layer is then deposited over the whole structure and, subsequently, a rapid-thermal-annealing process in a nitrogen or argon ambient is performed to convert the rest part of the second conductive gate layer 319a into a thick silicide layer 326b and to simultaneously form a thin silicide layer 326a over the deeper heavily-doped source/drain diffusion region 325a through the self-aligned source/drain contact holes. The refractory-metal layer used for the two-step self-aligned silicidation process is preferably titanium (Ti), cobalt (Co), or tantalum (Ta) etc..

FIG. 5G(a) shows the third embodiment of the present invention and is also shown in FIG. 2C; FIG. 5G(b) shows the fourth embodiment of the present invention and is also shown in FIG. 2D. The cross-sectional views in the channel-width direction for FIG. 5G(a) and FIG. 5G(b) are shown in FIG. 2F.

It should, be noted that the scaled MOSFETs of the present invention can be easily applied to implement complementary MOS (CMOS) integrated circuits having n-channel MOSFETs and p-channel MOSFETs formed simultaneously by just increasing a masking photoresist step for each implantation step. Moreover, the high-conductivity gate interconnection and the low parasitic gate-interconnection capacitance of the present invention may largely increase the speed of integrated circuits, especially for a high-density memory array having a long wordline.

While the present invention has been particularly shown and described with reference to the present examples and embodiments as considered as illustrative and not restrictive. Moreover, the present invention is not to be limited to the details given herein, it will be understood by those skilled in the art that various changes in form and detail may be made without departure from the true spirit and scope of the invention.

What is claimed is:

1. A method of fabricating a scaled MOSFET, comprising the steps of:

providing a semiconductor substrate;

forming a flat shallow-trench-isolation(STI) structure over said semiconductor substrate having an active region and an isolation region, wherein said active region has a first conductive gate layer formed over a thin gate-dielectric layer and said isolation region is filled with planarized field-oxides;

depositing sequentially a conductive barrier-metal layer, a metal layer, and a second masking dielectric layer over said flat STI structure;

pattering a gate line over said flat STI structure to form a gate region on said active region and a gate-interconnection region on said planarized field-oxides by selectively etching said second masking dielectric layer, said metal layer, and said conductive barrier-metal layer in sequence;

forming a first dielectric spacer over sidewalls of said gate line;

etching back said planarized field-oxides outside of said first dielectric spacer to a depth slightly smaller than a thickness of said first conductive gate layer;

etching anisotropically said first conductive gate layer to form a gate structure;

forming a first poly-oxide layer over sidewalls of said gate structure and a thicker oxide layer over each side portion of said active region having a graded gate-oxide layer formed near gate edges;

implanting a moderate dose of doping impurities having a dopant type opposite to that of said semiconductor substrate into said side portion of said active region in a self-aligned manner to form a shallow moderately-doped source/drain diffusion region;

performing a pocket (halo) implant having a dopant type opposite to that of said shallow moderately-doped source/drain diffusion region to form a punch-through stop in said side portion of said active region;

forming a second dielectric spacer over sidewalls of said first dielectric spacer and said first poly-oxide layer;

implanting a high dose of doping impurities having a dopant type opposite to that of said semiconductor substrate into said side portion of said active region outside of said second dielectric spacer in a self-aligned manner to form a deeper heavily-doped source/drain diffusion region;

performing a rapid-thermal-annealing process to redistribute implanted doping impurities with an extension portion of said shallow moderately-doped source/drain diffusion region formed under said graded gate-oxide layer;

removing said thicker oxide layer and simultaneously etching said planarized field-oxides outside of said second dielectric spacer in a self-aligned manner to form a self-aligned source/drain contact hole over said deeper heavily-doped source/drain diffusion region; and forming a self-aligned conductive layer over said deeper heavily-doped source/drain diffusion region through said self-aligned source/drain contact hole.

2. The method of claim 1, wherein said semiconductor substrate is a p-well or a p-type semiconductor substrate for fabricating an n-channel MOSFET or is an n-well or an n-type semiconductor substrate for fabricating a p-channel MOSFET.

3. The method of claim 1, wherein said conductive barrier-metal layer is preferably a refractory metal-nitride layer.

4. The method of claim 1, wherein said metal layer is preferably a high melting-point metal layer such as tungsten (W) or tungsten silicide ($WSi_2$).

5. The method of claim 1, wherein said first conductive gate layer is made of amorphous-silicon or polycrystalline-silicon implanted with n-type dopants for fabricating said n-channel MOSFET or implanted with p-type dopants for fabricating said p-channel MOSFET.

6. The method of claim 1, wherein said gate structure can be a steep-gate structure or a taper-gate structure having a taper angle between about 45 degrees and 90 degrees.

7. The method of claim 1, wherein said second masking dielectric layer is preferably made of silicon-nitrides or oxynitrides and said first dielectric spacer or said second dielectric spacer is preferably made of silicon-nitrides.

8. The method of claim 1, wherein said self-aligned conductive layer is preferably a refractory metal-silicide layer.

9. A method of fabricating a scaled MOSFET, comprising the steps of:
providing a semiconductor substrate;
forming a flat shallow-trench-isolation(STI) structure over said semiconductor substrate having an active region and an isolation region, wherein said active region has a first conductive gate layer formed over a thin gate-dielectric layer and said isolation region is filled with planarized field-oxides;
depositing sequentially a conductive barrier-metal layer, a second conductive gate layer, and a second masking dielectric layer over said flat STI structure;
patterning a gate line over said flat STI structure to form a gate region on said active region and a gate-interconnection region on said planarized field-oxides by selectively etching said second masking dielectric layer, said second conductive gate layer, and said conductive barrier-metal layer in sequence)
etching back said planarized field-oxides to a depth slightly smaller than a thickness of said first conductive gate layer;
etching anisotropically said first conductive gate layer to form a gate structure;
forming a first poly-oxide layer over sidewalls of said gate structure, a second poly-oxide layer over sidewalls of said second conductive gate layer, and a thicker oxide layer over each side portion of said active region having a graded gate-oxide layer formed near gate edges;
implanting a moderate dose of doping impurities having a dopant type opposite to that of said semiconductor substrate into said side portion of said active region in a self-aligned manner to form a shallow moderately-doped source/drain diffusion region;
performing a pocket (halo) implant having a dopant type opposite to that of said shallow moderately-doped source/drain diffusion region to form a punch-through stop in said side portion of said active region;

removing said second masking dielectric layer over said second conductive gate layer;
forming a first dielectric spacer over sidewalls of said second poly-oxide layer, said conductive barrier-metal layer, and said first poly-oxide layer;
implanting a high dose of doping impurities having a dopant type opposite to, that of said semiconductor substrate into said side portion of said active region outside of said first dielectric spacer in a self-aligned manner to form a deeper heavily-doped source/drain diffusion region;
performing a rapid-thermal-annealing process to redistribute implanted doping impurities with an extension portion of said shallow moderately-doped source/drain diffusion region formed under said graded gate-oxide layer;
performing a first-step self-aligned silicidation process for converting a major portion of said second conductive gate layer into a thicker silicide layer;
removing said thicker oxide layer and simultaneously etching said planarized field-oxides outside of said first dielectric spacer in a self-aligned manner to form a self-aligned source/drain contact hole over said deeper heavily-doped source/drain diffusion region; and
performing a second-step self-aligned silicidation process for forming a thin silicide layer over said deeper heavily-doped source/drain diffusion region and completely converting said second conductive gate layer into a thick silicide layer.

10. The method of claim 9, wherein said semiconductor substrate is a p-well or a p-type semiconductor substrate for fabricating an n-channel MOSFET or is an n-well or an n-type semiconductor substrate for fabricating a p-channel MOSFET.

11. The method of claim 9, wherein said conductive barrier-metal layer is preferably a refractory metal-nitride layer.

12. The method of claim 9, wherein said first conductive gate layer is made of amorphous-silicon or polycrystalline-silicon implanted with n-type dopants for fabricating said n-channel MOSFET or implanted with p-type dopants for fabricating said p-channel MOSFET.

13. The method of claim 9, wherein said gate structure can be a steep-gate structure or a taper-gate structure having a taper angle between about 45 degrees and 90 degrees.

14. The method of claim 9, wherein said second conductive gate layer is made of amorphous-silicon or polycrystalline-silicon.

15. The method of claim 9, wherein said second masking dielectric layer is preferably made of silicon-nitrides or oxynitrides and said first dielectric spacer is preferably made of silicon-nitrides.

16. The method of claim 9, wherein said thicker silicide layer or said thin silicide layer is preferably made of a refractory metal-silicide layer.

17. The method of claim 1 or claim 9, wherein said flat STI structure is fabricated by the steps comprising:
forming a multilayer structure over said semiconductor substrate by sequentially forming said thin gate-dielectric layer, said first conductive gate layer, and said first masking dielectric layer;
implanting a high dose of doping impurities having a dopant type opposite to that of said semiconductor substrate into said first conductive gate layer;
patterning said multilayer structure to define said active region by sequentially etching said first masking dielectric layer, said first conductive gate layer, and said thin gate-dielectric layer outside of said active region;

etching anisotropically said semiconductor substrate to form a shallow trench by using said first masking dielectric layer as an etching hard mask;

oxidizing sidewalls of said first conductive gate layer and a semiconductor surface of said shallow trench;

depositing a thick field-oxide film over said shallow trench and planarizing said thick field-oxide film using chemical-mechanical polishing (CMP) with said first masking dielectric layer as a polishing stop to form planarized field-oxides; and etching back said planarized field-oxides to a depth equal to a thickness of said first masking dielectric layer followed by removing said first masking dielectric layer to form said flat shallow-trench-isolation structure.

18. The method of claim 1 or claim 9, wherein said flat shallow-trench-isolation structure is fabricated by the steps comprising:

forming a multilayer structure over said semiconductor substrate by sequentially forming said thin gate-dielectric layer, said first conductive gate layer, and said first masking dielectric layer;

implanting a high-dose of doping impurities having a dopant type opposite to that of said semiconductor substrate into said first conductive gate layer;

patterning said multilayer structure to define said active region by sequentially etching said first masking dielec-tric layer, said first conductive gate layer, and said thin gate dielectric layer;

forming a thin silicon-oxide spacer over sidewalls of said first masking dielectric layer, said first conductive gate layer, and said thin gate dielectric layer;

etching anisotropically said semiconductor substrate to form a shallow trench by using said first masking dielectric layer and said thin silicon-oxide spacer as an etching hard mask;

oxidizing a semiconductor surface of said shallow trench to form a thin thermal-oxide layer;

depositing a thick field-oxide film over said shallow trench and planarizing said thick field-oxide film using chemical-mechanical polishing with said first masking dielectric layer as a polishing stop to form planarized field-oxides; and etching back said planarized field-oxides and said silicon-oxide spacer to a depth equal to a thickness of said first masking dielectric layer followed by removing said first masking dielectric layer to form said flat STI structure.

19. The method of claim 17 or claim 18, wherein said first masking dielectric layer is preferably made of silicon-nitrides.

20. The method of claim 17 or claim 18, wherein said thin gate dielectric layer is preferably a thermal-oxide layer or a nitrided thermal-oxide layer.

* * * * *